(12) United States Patent
Czech et al.

(10) Patent No.: US 7,202,532 B2
(45) Date of Patent: Apr. 10, 2007

(54) INTEGRATED CIRCUIT

(75) Inventors: Martin Czech, Freiburg (DE); Erwe Reinhard, Freiburg (DE)

(73) Assignee: Micronas GmbH, Freiburg (DE)

( * ) Notice: Subject to any disclaimer, the term of this patent is extended or adjusted under 35 U.S.C. 154(b) by 224 days.

(21) Appl. No.: 10/761,144

(22) Filed: Jan. 20, 2004

(65) Prior Publication Data
US 2004/0178506 A1    Sep. 16, 2004

(30) Foreign Application Priority Data
Jan. 17, 2003    (DE) ............................... 103 01 586

(51) Int. Cl.
*H01L 23/62*    (2006.01)
(52) U.S. Cl. ................... 257/360; 257/355; 257/356; 257/358; 327/432; 327/405; 327/436
(58) Field of Classification Search ............... 327/432, 327/405, 436, 417, 472, 474, 478; 257/355, 257/356, 360, 773, 358
See application file for complete search history.

(56) References Cited

U.S. PATENT DOCUMENTS 5,949,122 A * 9/1999 Scaccianoce ............... 257/469
6,744,107 B1 * 6/2004 Ker et al. .................... 257/401
6,791,122 B2 * 9/2004 Avery et al. ................. 257/173

* cited by examiner

*Primary Examiner*—Nathan Flynn
*Assistant Examiner*—Tan Tran
(74) *Attorney, Agent, or Firm*—O'Shea, Getz & Kosakowski, P.C.

(57) ABSTRACT

An integrated circuit includes at least two circuit components formed on a common semiconductor substrate. Each circuit component has a self-contained supply voltage system. Coupling circuits couple the supply voltage systems for the at least two circuit components. Each coupling circuit includes at least one transistor having a base formed by or within the substrate itself; more specifically, by or within a region of the substrate contiguous with collector doping zones and emitter doping zones of the transistor. The resistance between the transistor base and the potentials of the two supply voltage systems coupled by each of the coupling circuits is the intrinsic resistance of the substrate between the region forming the base and one of each contact doping zone conductively connected to the collector or emitter through a metallization applied to the substrate. To obtain an identical coupling behavior for the transistor in both directions, the collector and emitter of the transistor are preferably symmetrical, i.e., a transistor with a double emitter. The coupling circuit may be implemented with a single transistor, the dimensions of which are fixed by the desired volume resistivity. Greater flexibility of design with respect to accommodating the coupling circuit on one substrate surface without an increased area requirement is provided by employing multiple transistors as the coupling circuit. These transistors may be distributed independently of each other on the substrate surface.

16 Claims, 4 Drawing Sheets

INTEGRATED CIRCUIT

BACKGROUND OF THE INVENTION

The present invention relates to the field of integrated circuits, and in particular to integrated circuits that include at least two circuit components that are formed on a common semiconductor substrate and which each have self-contained supply voltage systems.

Integrated circuits may include at least two circuit components that are formed on a common semiconductor substrate and which each have self-contained supply voltage systems. In addition, each of the two circuit components may include self-contained bonding spots for receiving an externally supplied voltage. Separate supply voltage systems of this type may be necessary to meet EMC requirements. In conventional technologies for highly integrated circuits, the semiconductor substrate is p-conductive and is connected to the power supply nodes of the two circuit components that carry the lowest voltage potential (e.g., "Vss") among the applied potentials, such that the Vss potentials of the two circuit components are coupled by one substrate resistance.

One or more connections in the form of signal lines are often present between the two circuit components. The desirable isolation of the supply voltage systems for the individual circuit components may lead to problems in the event of excessive voltages, for example, electrical overstress (EOS). This is particularly true in the event of electrostatic discharge (ESD), since the separate supply voltage systems of the individual circuit components occupy a relatively smaller area and supply a smaller number of components than does a corresponding supply voltage system that services the entire integrated circuit. Therefore, such separate supply voltage systems react with relatively greater sensitivity to the switching operations of individual circuit components, and differential voltages are transferred from one circuit component to another through the signal lines and are thus able to reach sensitive circuit components, such as the gate-oxide layers, which may be destroyed by these voltages.

A prior art technique that attempts to solve this problem includes coupling the supply voltage systems for multiple circuit components integrated on a common semiconductor substrate using coupling circuits, as illustrated in FIG. 1. FIG. 1 is a schematic diagram illustration of a prior art integrated circuit 100 that includes first and second circuit components 1, 2, respectively. The first and second circuit components 1, 2 receive supply potentials Vcc1, Vss1, and Vcc2, Vss2, as illustrated, through associated bonding spots 5. Under normal operating conditions Vcc1=Vcc2 and Vss1=Vss2. The integrated circuit 100 also includes first and second coupling circuits 3, 4. The first coupling circuit 3 receives Vcc1 and Vcc2 on lines 102, 103 respectively, while the second coupling circuit 4 receives Vss1 and Vss2 on lines 104, 105 respectively. Each coupling circuit 3, 4 includes antiparallel connections of two PNP transistors 6. Whenever any excess voltage mutually disturbs the supply voltage systems of the first and second circuit components 1, 2, the transistors 6 produce a compensation of voltage, such that a portion of the current flows from the emitter to the base of each transistor 6, while the remainder of the current continues to flow to the collector of each of the transistors 6.

Each of the PNP transistors 6 has the semiconductor substrate as the collector, an n-doped well formed in the substrate as the base, and a $p^+$ region inside the well as the emitter. The effect of this arrangement is that when one of the coupling circuits 3, 4 opens in response to an excessive voltage of one of the transistors 6, although part of the compensation current (from the emitter to the base) will flow from one supply voltage system into the other, another part of the compensation current nevertheless will unavoidably flow directly from the emitter into the substrate representing the collector.

Another problem with these conventional coupling circuits 3, 4 is the considerable area they utilize on the substrate. Such considerable area is required because each of the coupling circuits 3, (each one of which being required for the corresponding supply voltage to be compensated) has two transistors 6. An additional reason that considerable area is required is because essentially holes are involved in the current flow through the transistors 6. The mobility of holes is less than that of electrons, and therefore requires comparatively greater coverage areas of the doping zones to achieve a volume resistivity of the transistors that is sufficiently low for effective coupling.

What is needed is an integrated circuit that includes at least two circuit components and separate supply voltage systems therefore, where the integrated circuit has a coupling circuit with a relatively small surface area between the supply voltage systems.

SUMMARY OF THE INVENTION

An integrated circuit includes at least two circuit components formed on a common semiconductor substrate. Each circuit component has a self-contained supply voltage system. Coupling circuits are used to couple the supply voltage systems for the at least two circuit components. Each coupling circuit includes at least one transistor having a base formed by or within the substrate itself; more specifically, by or within a region of the substrate contiguous with collector doping zones and emitter doping zones of the transistor. The resistance between the transistor base and the potentials of the two supply voltage systems coupled by each of the coupling circuits is the intrinsic resistance of the substrate between the region forming the base and one of each contact doping zone that is conductively connected to the collector or emitter through a metallization applied to the substrate. To obtain an identical coupling behavior for the transistor in both directions, the collector and emitter of the transistor are preferably symmetrical, such that the arrangement may also be termed a transistor with a double emitter.

The coupling circuit may be implemented with a single transistor, the dimensions of which are fixed by the desired volume resistivity. Greater flexibility of design with respect to accommodating the coupling circuit on one substrate surface without an increased area requirement is provided by employing multiple transistors as the coupling circuit. These transistors may be distributed independently of each other on the substrate surface.

A space-saving design results by creating the transistors using a plurality of doping zones of a second conductivity type different from a first conductivity type of the substrate, which are alternately connected to the first or second of the two power supply potentials. Specifically, if a doping zone connected to the power supply potential of the first circuit component is surrounded on both sides—in each case with an intermediate base zone having the natural doping of the substrate—by doping zones connected to the power supply potential of the second circuit component, then the resulting arrangement is the equivalent of two parallel transistors. In an arrangement of this type, the surface area requirement for two transistors is significantly less than the typically doublesized space requirement needed for two individual transistors. This savings in space may be increased even further if more than two transistors are created by providing an alternating arrangement of doping zones connected to the two power supply potentials.

To ensure the same behavior of these transistors, the transistor doping zones are arranged in series in an equidistant configuration. The contact doping zones are preferably located at the ends of the series. In one embodiment, two contact doping zones are sufficient for a plurality of transistors.

In this series arrangement of contact doping zones and emitter-forming doping zones, preferably each emitter-forming doping zone directly adjacent to a contact doping zone is metallically conductively connected to the contact doping zone. In the event of an excess voltage, this arrangement reduces the risk of a breakdown between a contact doping zone connected to the first circuit component and an emitter-forming doping zone connected to the second circuit component.

To achieve identical coupling behavior in both directions, the number of emitter-forming doping zones of the second conductivity type is an even number for the symmetry for the coupling circuit. In one embodiment the number of doping zones may be four, which corresponds to a parallel circuit of three transistors.

To avoid the undesirable interaction between the transistors of the coupling circuit and the circuit components, at least one transistor of the coupling circuit may be surrounded by a shielding doping zone of the second conductivity type. A shielding doping zone of this type is biased in the nonconducting direction, such that a barrier layer is formed between this zone and the substrate.

The shielding doping zone preferably runs in an annular pattern along the surface of the substrate. The doping zone does not prevent every current flow from the at least one transistor of the coupling circuit through the substrate to the circuit component, but rather forces the charge carrier to follow an alternate route into the depth of the substrate. This increases the route length, and thus the effective resistance of the substrate, between the transistors of the coupling circuit and the circuit components. The contact doping zones of the coupling circuit are preferably surrounded by the shielding doping zone.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
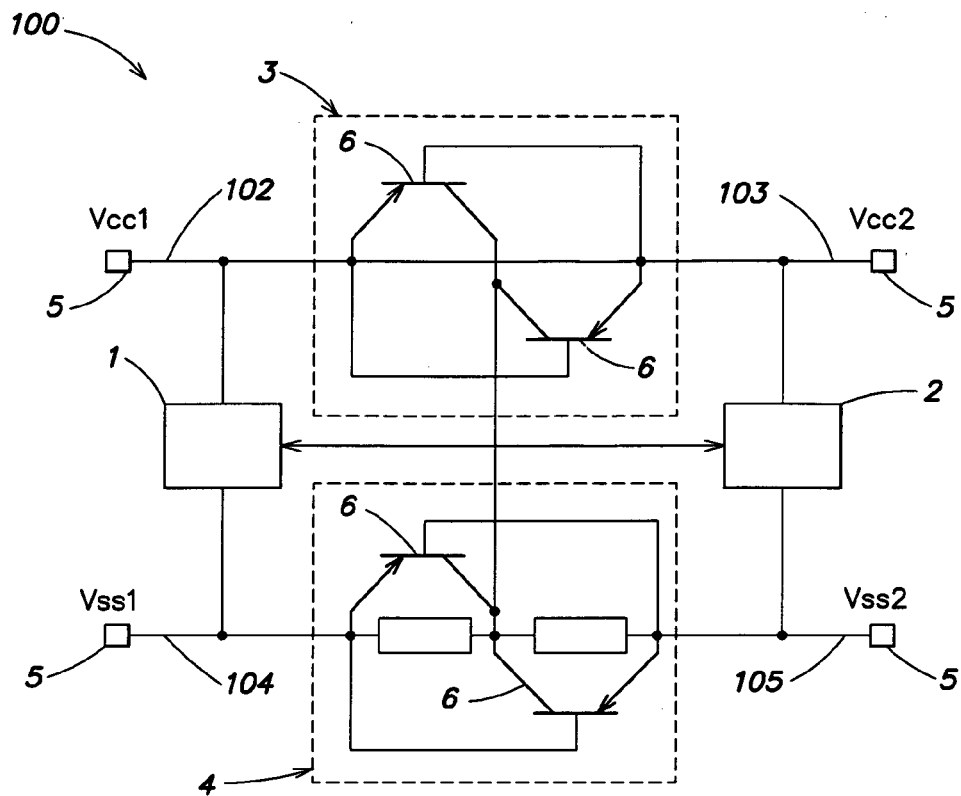
FIG. 1 is a schematic diagram illustration of a prior art integrated circuit.
Figure 2:
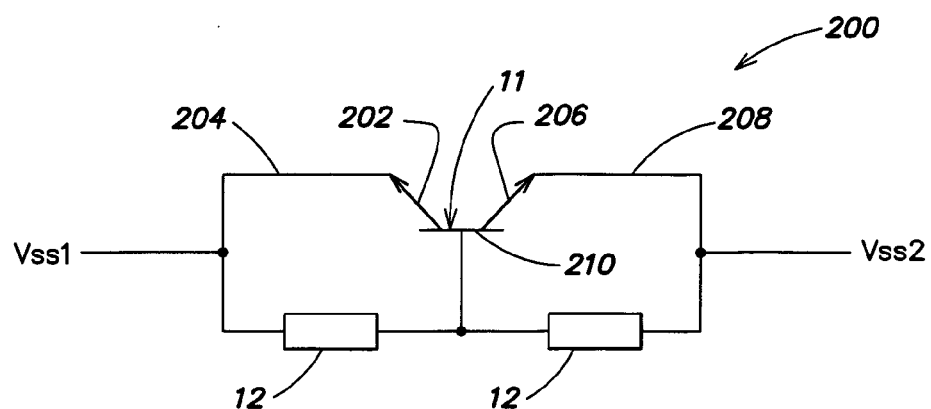
FIG. 2 is a schematic diagram illustration of a coupling circuit according to an aspect of the present invention.

FIG. 2 is a schematic diagram illustration of a coupling circuit 200, which is an improvement to the prior art coupling circuit 100 of FIG. 1. The coupling circuit 200 includes an NPN transistor 11, the geometry and doping of which are symmetrical. The transistor 11 includes a first emitter 202 that is connected on a line 204 to a first voltage potential Vss1, and a second emitter 206 that is connected on a line 208 to a second voltage potential Vss2. The two power supply potentials Vss1, Vss2 are each connected through identical resistances 12 to a transistor base 210.

Figure 3:
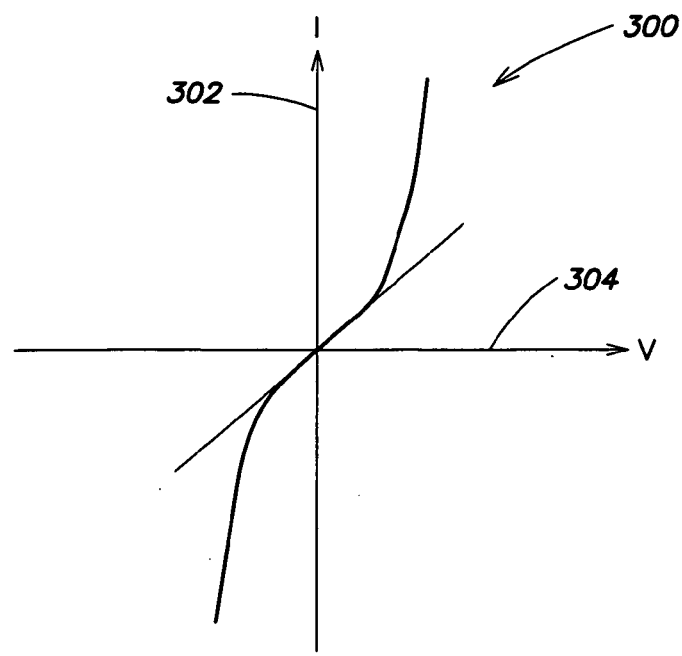
FIG. 3 is a plot of the current-voltage characteristic of the coupling circuit of FIG. 2.

FIG. 3 is a plot 300 of the current-voltage characteristic of the coupling circuit illustrated in FIG. 2. Current is plotted along the vertical axis 302 and voltage is plotted along the horizontal axis 304. In response to small differences between the two power supply potentials, the behavior is resistive and is determined by the resistances 12 (FIG. 2). The activity of the transistor 11 is activated in response to increasing voltages, and the compensating current I flowing through the coupling circuit 200 increases with increasing voltage V at a greater than linear rate.

Figure 4:
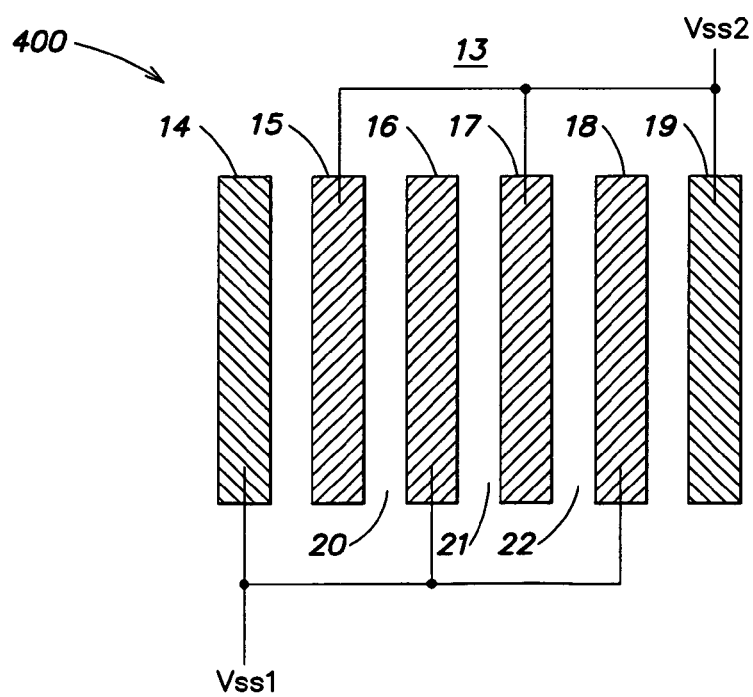
FIG. 4 illustrates the surface structure of a coupling circuit.

FIG. 4 illustrates a first example of the surface structure of a coupling circuit 400. The coupling circuit 400 includes a plurality of doping zones 14–19 formed adjacently in a series on a $p^-$-doped semiconductor substrate 13. The most external ones of these zones are $p^+$-doped and are designated as the outer contact doping zones 14 and 19. The intermediate emitter doping zones 15–18 are $n^+$-doped. Surface metallizations of the doping zones 14, 16, 18 are connected to the first voltage potential Vss1, while those of the doping zones 15, 17, 19 are connected to the second voltage potential Vss2. Surface strips 20, 21, 22 of the substrate 13 are located between the emitter doping zones 15–18, and have the original $p^-$-doping of the substrate in a doping concentration unaltered by the generation of the doping zones 14–19. The surface strips 20–22 each function as the base of a symmetrical transistor, the two emitters of which are formed by the two emitter doping zones contiguous with the relevant surface strips 20–22. In the event of a voltage difference between Vss1 and Vss2, the contact doping zones 14 and 19 allow a flow of current through the substrate 13 from one contact doping zone 14 and 19 to another. This current flow determines the corresponding electrical potentials effective in the region of the individual surface strips 20–22.

Figure 5:
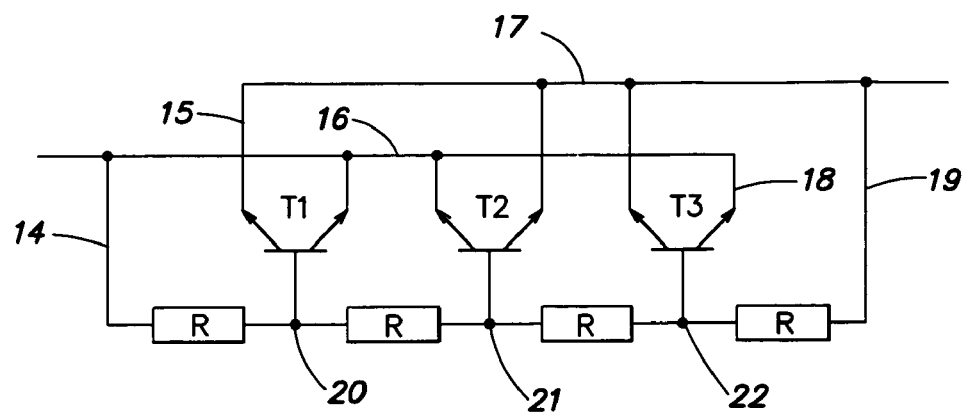
FIG. 5 is an equivalent circuit diagram of the surface structure of FIG. 4.

The equivalent circuit diagram illustrated in FIG. 5 corresponds to the layout of the surface structure of FIG. 4. The two middle emitter doping zones 16, 17 of the layout of FIG. 4 correspond to the two symmetrical npn transistors T1, T2, or T2, T3, the bases of which are each formed by the surface strips 20–22. The resistances R between the contact doping zone 14, the bases of the transistors T1–T3, and the contact doping zone 19 result from the relatively low intrinsic conductivity of the weakly doped substrate 13.

Figure 6:
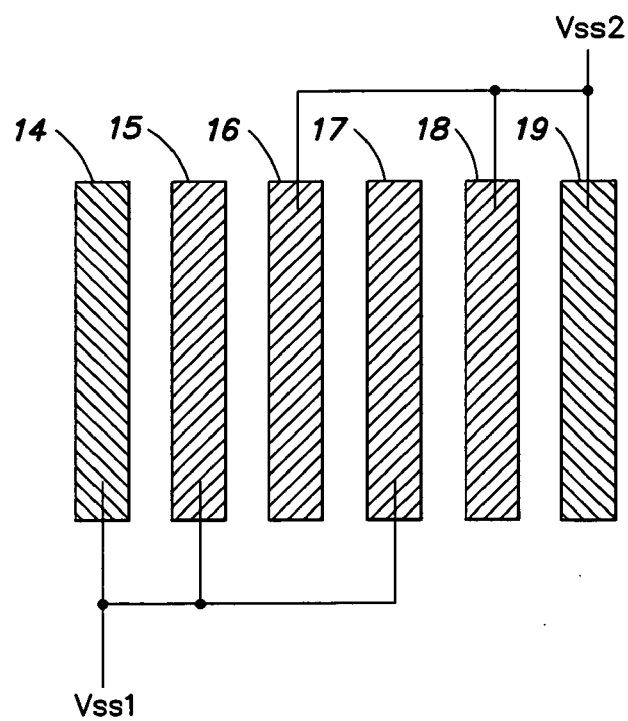
FIG. 6 illustrates a modification of the surface structure of FIG. 4.

FIG. 6 illustrates another layout of a coupling circuit. The layout of FIG. 6 differs from the layout of FIG. 4 in that the emitter zones connected to Vss1 or Vss2 are transposed such that the respective adjacent doping zones 14 and 15, or 18 and 19, are connected in parallel through a metallization. The fact that this approach for the layout increases the distance, compared to the layout of FIG. 4, between the contact implantation zones 14 or 19 and the immediately adjacent emitter doping zones 16, 17 connected to the other power supply voltage—thereby also increasing the substrate resistance by a corresponding amount—reduces the risk that an excess voltage pulse will cause a breakdown at the pn boundary of the emitter doping zones. That is, the dielectric strength is enhanced in the layout of FIG. 6, as compared with the layout of FIG. 4, with the same dimensioning and arrangement of the doping zones. Also, the width of the surface strips between the contact doping zones 14 and 19 and the adjacent emitter doping zones 15 and 18, respectively, may be reduced with the dielectric strength remaining the same, thereby further decreasing the space requirement of the coupling circuit.

Figure 7:
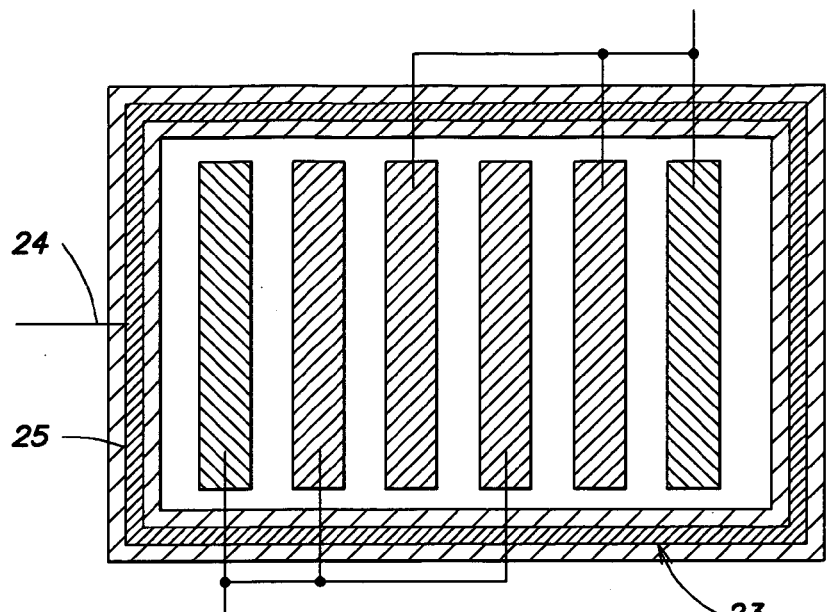
FIG. 7 illustrates a modification of the surface structure of FIG. 6.
Figure 8:
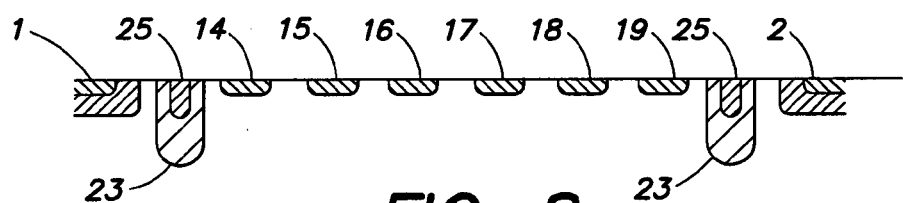
FIG. 8 is a cross-section through the structure of FIG. 7.

FIG. 7 illustrates a modification of the layout design of FIG. 6. Since the transistors formed by the surface strips 20–22 and the adjacent emitter doping zones 15–18 are connected to the substrate 13, a shielding doping zone 23 is provided to reduce the interactions between the transistors of the coupling circuit and the elements of the circuit components 1, 2. The shielding doping zone is formed by n-doping with a high penetration depth into the substrate 13. On the surface of the substrate 13, the shielding doping zone 23 is highly n-doped on a small cross-sectional area to form a contact zone 25, which is in conductive contact with a metallization 24 deposited on the substrate surface. The shielding doping zone has low n-doping over the majority of its cross-section, as indicated by the widely spaced hatching, and a lower doping concentration than in the other n-doped emitter doping zones. As the cross-section in FIG. 8 illustrates, the shielding doping zone 23 significantly lengthens the current path from the emitter doping zones 15–18 to the adjacent elements of the circuit components 1 or 2 (not shown in FIG. 7). The effect of the shielding is due to a positive potential applied to the shielding doping zone 23 over the metallization area 24, which potential results in the formation of a barrier layer at the pn junction between the shielding doping zone 23 and the substrate 13.

Figure 9:
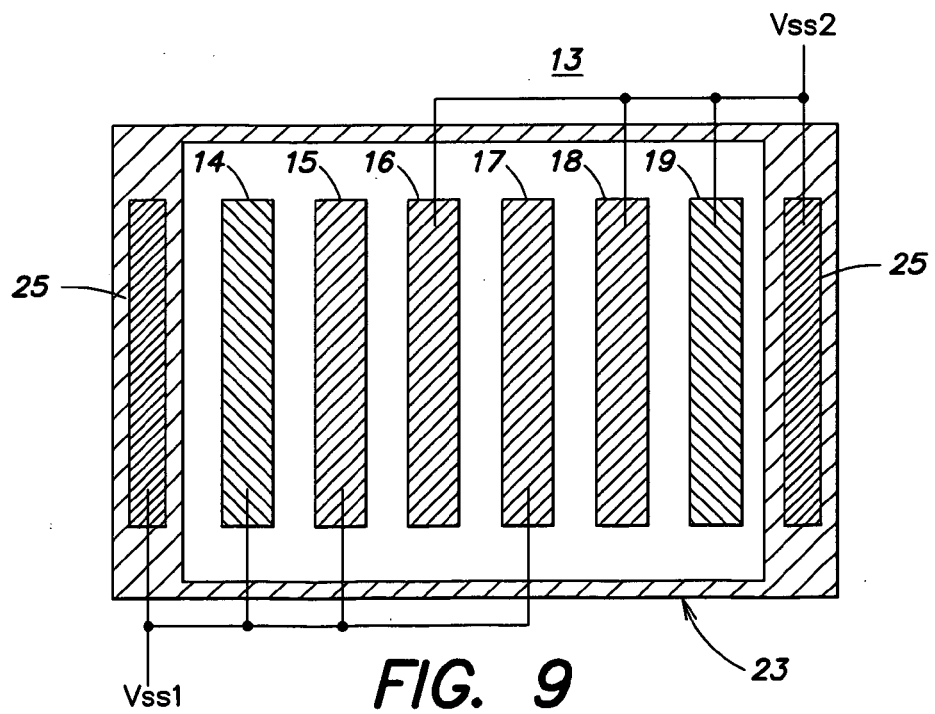
FIG. 9 illustrates a modification of the surface structure of FIG. 6.

FIG. 9 illustrates another modified design of the layout of FIG. 6. The shielding doping zone 23 is configured in an annular shape which surrounds the emitter doping zones 15–18. In contrast to the layout of FIG. 7, the contact zone 25 is not arranged in an annular configuration around the transistors of the coupling circuit, but is limited to two islands, each of which is conductively connected to one of the two potentials Vss1, Vss2. Since it is possible to keep the doping concentration relatively low in the shielding doping zone 23, its conductivity may be maintained at a low value similar to that of the substrate 13.

Although the present invention has been shown and described with respect to several preferred embodiments thereof, various changes, omissions and additions to the form and detail thereof, may be made therein, without departing from the spirit and scope of the invention.

What is claimed is:

1. An integrated circuit, comprising:
   a semiconductor substrate of a first conductivity type;
   at least two circuit components formed in the semiconductor substrate, where each circuit component is connected between a pair of supply voltages of differing values; and
   a coupling circuit connected to a first one of the supply voltages, where the coupling circuit includes at least one transistor having a base of the first conductivity type, a collector, and an emitter of a second conductivity type, where the base is connected through a resistance to the first one of the supply voltages and the collector and the emitter are connected directly to the first one of supply voltages, and where the emitter and collector each comprise corresponding doping zones of the second conductivity type arranged symmetrically and connected through a surface metallization to the first one of the supply voltages.

2. The integrated circuit of claim 1, where the base of the transistor comprises a region of the substrate, and where the resistance comprises an intrinsic resistance of the substrate disposed between the base and a contact doping zone metallically connected to one of the collector and emitter.

3. The integrated circuit of claim 1, where the coupling circuit includes a plurality of transistors connected in parallel between the first one of the supply voltages.

4. The integrated circuit of claim 3, where each of the transistors comprises a plurality of doping zones of the second conductivity type, where the doping zones are alternately connected to the first one of the supply voltages.

5. The integrated circuit of claim 4, where the plurality of doping zones are arranged in an equidistant configuration.

6. The integrated circuit of claim 5, where the plurality of doping zones are extended transversely relative to the equidistant configuration.

7. The integrated circuit of claim 6, further comprising a plurality of contact doping zones, where the plurality of contact doping zones are located at the ends of the equidistant configuration.

8. The integrated circuit of claim 7, where each one of the plurality of contact doping zones is disposed adjacent to and is metallically connected to one of the plurality of doping zones.

9. The integrated circuit of claim 8, where the number of doping zones is an even number.

10. The integrated circuit of claim 8, where the number of doping zones equals four.

11. The integrated circuit of claim 3, where each of the plurality of transistors is surrounded by a shielding doping zone of the second conductivity type.

12. The integrated circuit of claim 11, where the shielding doping zone is biased in the nonconducting direction.

13. The integrated circuit of claim 11, where the shielding doping zone extends in an annular configuration along the surface of the substrate.

14. The integrated circuit of claim 13, where the shielding doping zone includes a highly doped contact zone.

15. The integrated circuit of claim 14, where the contact zone includes two islands, each island being conductively connected to a corresponding one of the pair of supply voltages.

16. The integrated circuit of claim 11, where shielding doping zone includes the contact doping zones.

* * * * *

UNITED STATES PATENT AND TRADEMARK OFFICE
CERTIFICATE OF CORRECTION

PATENT NO. : 7,202,532 B2
APPLICATION NO. : 10/761144
DATED : April 10, 2007
INVENTOR(S) : Czech et al.

It is certified that error appears in the above-identified patent and that said Letters Patent is hereby corrected as shown below:

On the Title Page, item [54]
Delete the current title and insert --VOLTAGE COUPLING CIRCUIT FOR AN INTEGRATED CIRCUIT--

Column 1
Line 1, delete "INTEGRATED CIRCUIT" and insert --VOLTAGE COUPLING CIRCUIT FOR AN INTEGRATED CIRCUIT--

Signed and Sealed this

Twenty-ninth Day of May, 2007

JON W. DUDAS
*Director of the United States Patent and Trademark Office*